(12) United States Patent
Takahashi et al.

(10) Patent No.: US 12,261,028 B2
(45) Date of Patent: Mar. 25, 2025

(54) PLASMA PROCESSING APPARATUS

(71) Applicant: TOKYO ELECTRON LIMITED, Tokyo (JP)

(72) Inventors: Shuichi Takahashi, Miyagi (JP); Takaharu Miyadate, Miyagi (JP); Takaaki Kikuchi, Miyagi (JP); Atsushi Ogata, Miyagi (JP); Nobutaka Sasaki, Miyagi (JP); Takashi Taira, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/210,012

(22) Filed: Jun. 14, 2023

(65) Prior Publication Data

US 2023/0326725 A1 Oct. 12, 2023

Related U.S. Application Data

(63) Continuation of application No. 16/582,115, filed on Sep. 25, 2019, now abandoned.

(30) Foreign Application Priority Data

Sep. 26, 2018 (JP) .................................. 2018-180956

(51) Int. Cl.
*H01J 37/32* (2006.01)
*H01L 21/67* (2006.01)
(Continued)

(52) U.S. Cl.
CPC .. *H01J 37/32642* (2013.01); *H01J 37/32724* (2013.01); *H01L 21/68735* (2013.01);
(Continued)

(58) Field of Classification Search
None
See application file for complete search history.

(56) References Cited

U.S. PATENT DOCUMENTS 6,044,534 A 4/2000 Seo et al.
7,004,107 B1 * 2/2006 Raoux ............... H01J 37/32174
156/345.43

(Continued)

FOREIGN PATENT DOCUMENTS

JP 2000-269197 A 9/2000
JP 2002-110652 A 4/2002
(Continued)

*Primary Examiner* — Allan W. Olsen
(74) *Attorney, Agent, or Firm* — XSENSUS LLP (57) ABSTRACT

In a plasma processing apparatus, a table has a wafer support to hold a wafer and a peripheral segment surrounding the wafer support and having through-holes. The peripheral segment has an upper surface lower than that of the wafer support. An outer focus ring is disposed over the peripheral segment and has a recess or a cutout at an inner portion of the outer focus ring, and the recess or cutout has through-holes. An inner focus ring is disposed in the recess or cutout of the outer focus ring. Lift pins respectively extend through the through-holes of the peripheral segment and the through-holes of the recess or cutout of the outer focus ring. Shift mechanisms control shift of the respective lift pins.

12 Claims, 7 Drawing Sheets

(51) Int. Cl.
*H01L 21/683* (2006.01)
*H01L 21/687* (2006.01)

(52) U.S. Cl.
CPC .. *H01L 21/68742* (2013.01); *H01J 2237/002* (2013.01); *H01J 2237/20235* (2013.01); *H01J 2237/334* (2013.01); *H01L 21/67069* (2013.01); *H01L 21/6833* (2013.01)

(56) References Cited

U.S. PATENT DOCUMENTS

| | | | |
|---|---|---|---|
| 7,338,578 | B2 | 3/2008 | Huang et al. |
| 7,524,397 | B2* | 4/2009 | Hao ................. H01J 37/32642 |
| | | | 156/345.43 |
| 9,349,618 | B2 | 5/2016 | Yamawaku et al. |
| 11,728,143 | B2* | 8/2023 | Sarode Vishwanath ..................... |
| | | | H01L 21/68742 |
| | | | 156/345.1 |
| 2003/0106647 | A1 | 6/2003 | Koshiishi et al. |
| 2004/0134617 | A1 | 7/2004 | Wang et al. |
| 2004/0134618 | A1 | 7/2004 | Endoh et al. |
| 2004/0168640 | A1 | 9/2004 | Muto et al. |
| 2004/0261946 | A1* | 12/2004 | Endoh .............. H01J 37/32642 |
| | | | 156/345.1 |
| 2007/0000614 | A1 | 1/2007 | Hatamura et al. |
| 2011/0031111 | A1* | 2/2011 | Kobayashi ........ H01J 37/32623 |
| | | | 204/298.36 |
| 2014/0209245 | A1* | 7/2014 | Yamamoto .......... H01L 21/6831 |
| | | | 361/234 |
| 2014/0311676 | A1 | 10/2014 | Hatoh et al. |
| 2016/0211166 | A1* | 7/2016 | Yan ................... H01L 21/68742 |
| 2016/0307742 | A1 | 10/2016 | Mishra et al. |
| 2017/0213758 | A1 | 7/2017 | Rice et al. |
| 2017/0263478 | A1* | 9/2017 | McChesney et al. .. H01J 37/20 |
| 2018/0166259 | A1* | 6/2018 | Ueda ................. H01J 37/32642 |
| 2018/0277416 | A1* | 9/2018 | Takahashi ......... H01L 21/68785 |
| 2018/0350565 | A1* | 12/2018 | Matsuyama ...... H01J 37/32642 |
| 2020/0020565 | A1* | 1/2020 | Rathnasinghe ... H01L 21/68742 |
| 2020/0234981 | A1* | 7/2020 | Schmid ............... C23C 16/4401 |
| 2020/0312633 | A1* | 10/2020 | Rathnasinghe ... H01J 37/32642 |
| 2020/0328105 | A1* | 10/2020 | Sun ................... H01J 37/32082 |
| 2020/0395195 | A1* | 12/2020 | Sanchez ............ H01L 21/67069 |
| 2021/0327688 | A1* | 10/2021 | Sasaki ................... H01L 21/677 |
| 2022/0319904 | A1* | 10/2022 | Rice ................. H01L 21/68742 |

FOREIGN PATENT DOCUMENTS

| | | |
|---|---|---|
| JP | 2008-244274 A | 10/2008 |
| JP | 2012-146743 A | 8/2012 |
| JP | 2012-182496 A | 9/2012 |
| WO | 2008/140982 A1 | 11/2008 |
| WO | 2013/108750 A1 | 7/2013 |

* cited by examiner

PLASMA PROCESSING APPARATUS

CROSS-REFERENCE TO RELATED APPLICATIONS

This application is a continuation application of U.S. application Ser. No. 16/582,115, filed on Sep. 25, 2019, which claims priority to Japanese Patent Application No. 2018-180956, filed on Sep. 26, 2018, the entire contents of which are incorporated herein by reference and priority is claimed to each.

TECHNICAL FIELD

The present disclosure relates to a plasma processing apparatus.

BACKGROUND

As it is known, a plasma processing apparatus including a focus ring has been provided (see, Japanese Patent Application Publication No. 2008-244274). The focus ring is disposed to surround an outer periphery of a processing target, e.g., a semiconductor wafer (hereinafter, referred to as "wafer"). The focus ring is provided to control plasma near the outer periphery of the wafer to improve in-plane etching uniformity of the wafer.

The present disclosure provides a technique capable of improving the positional accuracy in driving and transferring the focus ring.

SUMMARY

In accordance with an aspect of the present disclosure, there is provided a plasma processing apparatus including: a table having a wafer support to hold a wafer and a peripheral segment surrounding the wafer support and having through-holes, the peripheral segment having an upper surface lower than that of the wafer support; an outer focus ring disposed over the peripheral segment and having a recess or a cutout at an inner portion of the outer focus ring, the recess or cutout having through-holes; an inner focus ring disposed in the recess or cutout of the outer focus ring; lift pins respectivley extending through the through-holes of the peripheral segment and the through-holes of the recess or cutout of the outer focus ring; and shift mechanisms to control shift of the respective lift pins.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings. The following embodiments are not intended to limit the present disclosure. The respective embodiments may be appropriately combined with each other within a range in which processing contents do not contradict each other. Like reference numerals will be given to substantially like parts throughout this specification and the drawings, and redundant description thereof will be omitted.

In the following description, when a wafer is held on a table of a plasma processing apparatus, the table side when viewed from the wafer is referred to as "lower side," and the opposite side is referred to as "upper side."

Figure 1:
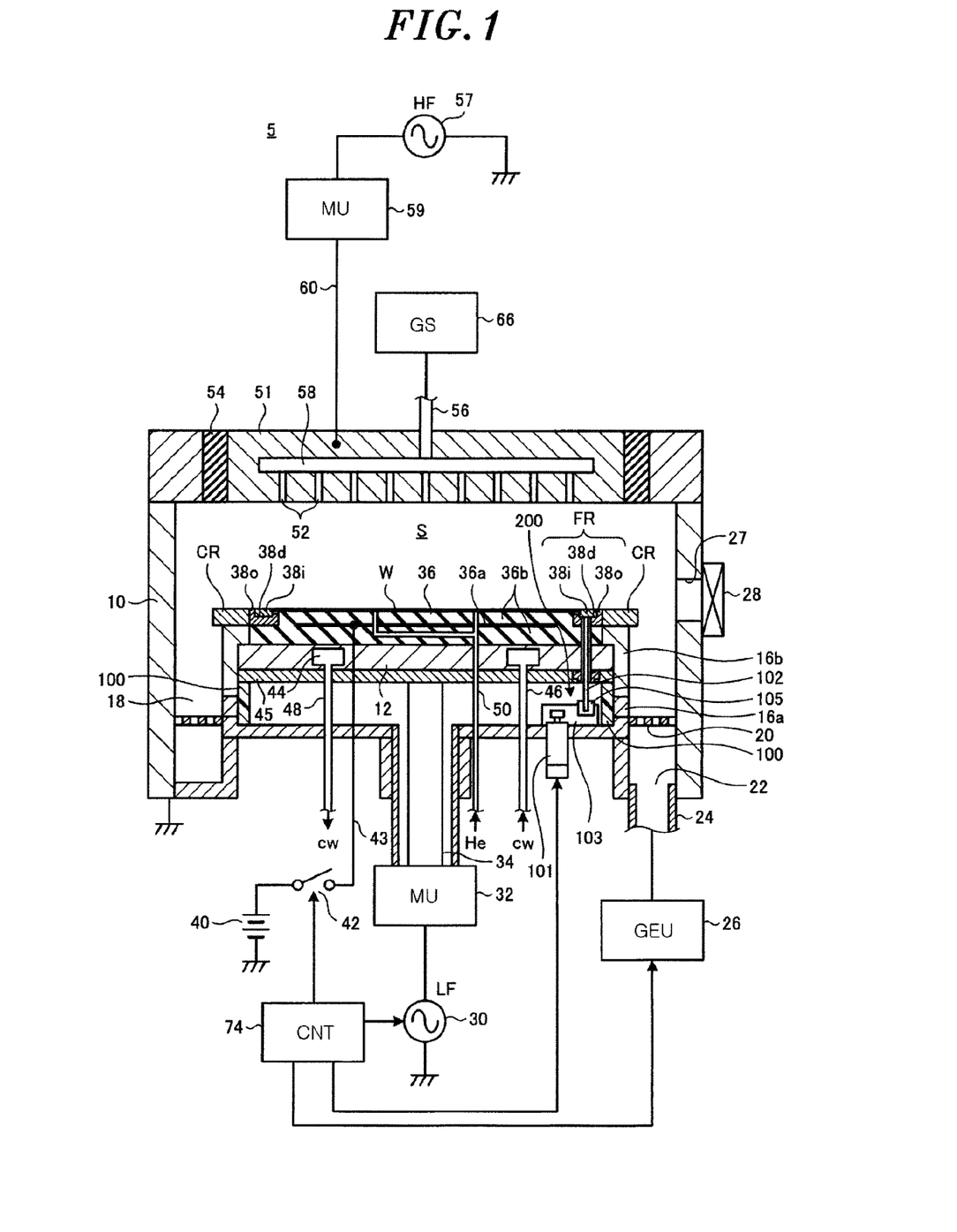
FIG. 1 shows an example of a configuration of a plasma processing apparatus according to an embodiment.

FIG. 1 shows an example of a configuration of a plasma processing apparatus 5 according to an embodiment. In the present embodiment, a capacitively coupled parallel plate type plasma processing apparatus will be described as an example of the plasma processing apparatus 5.

The plasma processing apparatus 5 includes a chamber 10 that is a cylindrical vacuum container made of a metal such as aluminum, stainless steel, or the like. The chamber 10 is an example of a processing container and has an inner space serving as a processing chamber where plasma processing is performed. The chamber 10 is grounded.

At a lower central portion of the chamber 10, a disk-shaped stage 12 for mounting thereon a target object, e.g., a wafer W, is disposed as a substrate holder serving as a lower electrode. The stage 12 is supported by a cylindrical support 16 that is made of, e.g., aluminum, and extends vertically upward from the bottom of the chamber 10 and a housing 100 disposed at an inner side of the cylindrical support 16. In the example shown in FIG. 1, a structure 45 is disposed between the stage 12 and the housing 100. A recess is formed on a contact surface between the structure 45 and the stage 12, and a sealing member 47 is disposed in the recess. The housing 100 is made of, e.g., ceramic. In the example shown in FIG. 1, the cylindrical support 16 includes an aluminum portion 16a disposed at a lower portion of the chamber 10 and a quartz portion 16b disposed on the aluminum portion 16a.

An annular gas exhaust passage 18 is formed between the cylindrical support 16 and an inner wall of the chamber 10. An annular baffle plate 20 is installed at an upstream side or an inlet of the gas exhaust passage 18, and a gas exhaust port 22 is provided at a downstream side of the gas exhaust passage 18. The baffle plate 20 is fitted to the cylindrical support portion 16 to be reinforced by the aluminum portion 16a.

A gas exhaust unit (GEU) 26 is connected to the gas exhaust port 22 through a gas exhaust line 24. The gas exhaust unit 26 has a vacuum pump such as a turbo molecular pump or the like, and thus can reduce a pressure in a plasma generation space S in the chamber 10 to a desired vacuum level. A gate valve 28 for opening and closing a loading/unloading port 27 for the wafer W is disposed an outer sidewall of the chamber 10.

A second high frequency power supply 30 is electrically connected to the stage 12 via a matching unit (MU) 32 and a power feed rod 34. The second high frequency power supply 30 is configured to output a high frequency power LF at a variable power level, the high frequency power LF having a first frequency (e.g., 13.56 MHz) suitable for controlling energy of ions to be attracted to the wafer W. The matching unit 32 includes a reactance variable matching circuit for matching an impedance of the second high frequency power supply 30 side and an impedance of a load (plasma or the like) side.

An electrostatic chuck 36 for attacting and holding the wafer W by a Coulomb force is disposed on an upper surface of the stage 12. The electrostatic chuck 36 has an electrode 36a made of a conductive film and two insulating films 36b. The electrode 36a is embedded between the two insulating films 36b, and a DC power supply 40 is electrically connected to the electrode 36a through a switch 42 and a coated wire 43. The insulating films 36b are made of, e.g., a ceramic sintered body. The wafer W is attracted and held on the electrostatic chuck 36 by an electrostatic force such as a Coulomb force generated by a DC current supplied from the DC power supply 40. A heater H that is a heating element is disposed in the electrostatic chuck 36. A heater power supply (not shown) is connected to the heater H. The temperature of the wafer W on the electrostatic chuck 36 is controlled to a predetermined temperature by heating using the heater H and cooling using a coolant to be described later. Further, the heater H may be disposed in the stage 12.

An annular coolant channel 44 extending in, e.g., a circumferential direction, is formed in the stage 12. A coolant, e.g., cooling water cw, having a predetermined temperature is supplied from a chiller unit through lines 46 and 48 and circulated in the coolant flow channel 44. Accordingly, the temperature of the wafer W on the electrostatic chuck 36 can be controlled by the temperature of the coolant. In addition, a heat transfer gas such as He gas from a heat transfer gas supply unit is supplied to a gap between an upper surface of the electrostatic chuck 36 and the backside of the wafer W through a gas supply line 50. Further, a pusher pin that is raised and lowered while penetrating through the stage 12 in a vertical direction to load and unload the wafer W, and a shift mechanism for driving the pusher pin are provided.

A gas shower head 51 is disposed to block an opening formed at the ceiling of the chamber 10 through a shield ring 54 that covers an outer edge of the gas shower head 51. The gas shower head 51 is made of silicon. The gas shower head 51 also serves as a facing electrode (upper electrode) opposite to the stage 12 (lower electrode).

A gas inlet 56 for introducing a gas is formed at the gas shower head 51. A diffusion space 58 connected to the gas inlet 56 is disposed in the gas shower head 51. The gas outputted from a gas supply source (GS) 66 is supplied to the diffusion space 58 through the gas inlet 56, and then diffused and introduced into the plasma generation space S through a plurality of gas injection holes 52.

A first high frequency power supply 57 is electrically connected to the gas shower head 51 through a matching unit (MU) 59 and a power feed line 60. The first high frequency power supply 57 is configured to output a high frequency power HF at a variable power level, the high frequency power HF having a second frequency (e.g., 40 MHz) that is suitable for plasma generation and is higher than the first frequency. The matching unit 59 includes a reactance variable matching circuit for matching an impedance of the first high frequency power supply 57 side and the impedance of the load (plasma or the like) side.

A controller (CNT) 74 includes, e.g., a microcomputer, and is configured to control the operations of the respective components in the plasma processing apparatus 5 and the operation of the entire apparatus. The components of the plasma processing apparatus 5 include the gas exhaust unit 26, the first high frequency power supply 57, the second high frequency power supply 30, the matching units 32 and 59, the switch 42 for the electrostatic chuck, the gas supply source (GS) 66, the chiller unit, the heat transfer gas supply unit, and the like.

In order to perform various processes such as etching and the like in the plasma processing apparatus 5, first, the gate valve 28 is opened, and the wafer W is loaded into the chamber 10 and mounted on the electrostatic chuck 36. Then, the gate valve 28 is closed, and a predetermined gas is introduced from the gas supply source 66 into the chamber 10 at a predetermined flow rate and a predetermined flow rate ratio. Then, the pressure in the chamber 10 is reduced to a predetermined set value by the gas exhaust unit 26. Further, the first high frequency power supply 57 is turned on to output the high frequency power HF for plasma generation at a predetermined power level. The high frequency power HF is supplied to the gas shower head 51 through the matching unit 59 and the power feed line 60.

When the high frequency power LF for ion attraction control is applied, the second high frequency power supply 30 is turned on to output the high frequency power LF at a predetermined power level. The high frequency power LF is applied to the stage 12 through the matching unit 32 and the power feed rod 34. In addition, the heat transfer gas is supplied from the heat transfer gas supply unit to the contact surface between the electrostatic chuck 36 and the wafer W. Further, the switch 42 is turned on to apply the DC voltage from the DC power supply 40 to the electrode 36a of the electrostatic chuck 36, and the heat transfer gas is confined to the contact surface by electrostatic attractive force.

<Configuration of Focus Ring FR According to Embodiment>

A focus ring FR is disposed at an outer periphery of the stage 12 to annularly surround an outer periphery of the wafer W. The focus ring FR is configured to control the plasma at the outer periphery of the wafer and improve the uniformity of the processing such as an in-plane etching rate of the wafer W or the like. In addition, a cover ring CR is disposed to surround an outer periphery of the focus ring FR. The cover ring CR is a ring-shaped member made of, e.g., quartz, and protects an upper surface of the cylindrical support 16 from the plasma.

The etching rate and/or the etching shape at an edge portion of the wafer W changes depending on a height of the focus ring FR. Therefore, when the height of an upper surface of the focus ring FT changes due to consumption of the focus ring FR, the sheath shape above the edge portion of the wafer W changes which leads to the change of the processing shape at the edge portion of the wafer W. In the present embodiment, the edge portion of the wafer W indicates a ring-shaped portion spaced apart from the center of the wafer W by a distance of about 140 mm to 150 mm in a radial direction. The clearance between the components of the plasma processing apparatus 5 may be about 0.1 mm to 0.5 mm. However, the clearance is appropriately omitted in the drawings.

Therefore, the plasma processing apparatus 5 of the present embodiment includes the focus ring FR that is divided into two parts. In the present embodiment, the focus ring FR is divided into an inner focus ring 38i and an outer focus ring 38O.

Further, the plasma processing apparatus 5 of the present embodiment is configured to adjust a position of an upper surface of the inner focus ring 38i that affects the in-plane etching uniformity of the wafer in response to the consumption of the focus ring FR. Further, the plasma processing apparatus 5 of the present embodiment is configured to automatically replace the inner focus ring 38i without opening and closing the chamber 10. Therefore, the plasma processing apparatus 5 of the present embodiment further includes shift mechanisms 200 and lift pins 102 in a one-to-one relationship with the shift mechanisms 200. Hereinafter, the adjustment of the position of the upper surface of the inner focus ring 38i, which is performed to maintain the uniformity of the plasma processing, is referred to as "first shift control." The control for raising the inner focus ring 38i in order to replace and transfer the inner focus ring 38i is referred to as "second shift control."

When the first shift control is performed, each of the shift mechanisms 200 adjusts a shift amount of the corresponding the lift pin 102 with a driving precision of 0.02 mm at a pitch of 1.0 mm to 2.0 mm, for example. The position of the upper surface of the inner focus ring 38i is adjusted by the shift of the respective lift pins 102.

When the second shift control is performed, each of the shift mechanisms 200 adjusts the shift amount of the corresponding lift pin 102 with a driving precision of about 0.1 mm at a pitch of about 20 mm, e.g., 18 mm. In other words, in the second shift control, the shift mechanisms 200 move the lift pins 102 at a pitch larger than that used for adjusting the position of the upper surface of the inner focus ring 38i. As the lift pins 102 are moved up, the inner focus ring 38i is lifted. The lifted inner focus ring 38i can be transferred to the outside of the chamber 10 by the same transfer unit as that used for transferring the wafer W. Thereafter, a new inner focus ring 38i can be transferred into the chamber 10 in the same manner as for transferring the wafer W.

<Configuration Example of Shift Mechanism 200>

Figure 2:
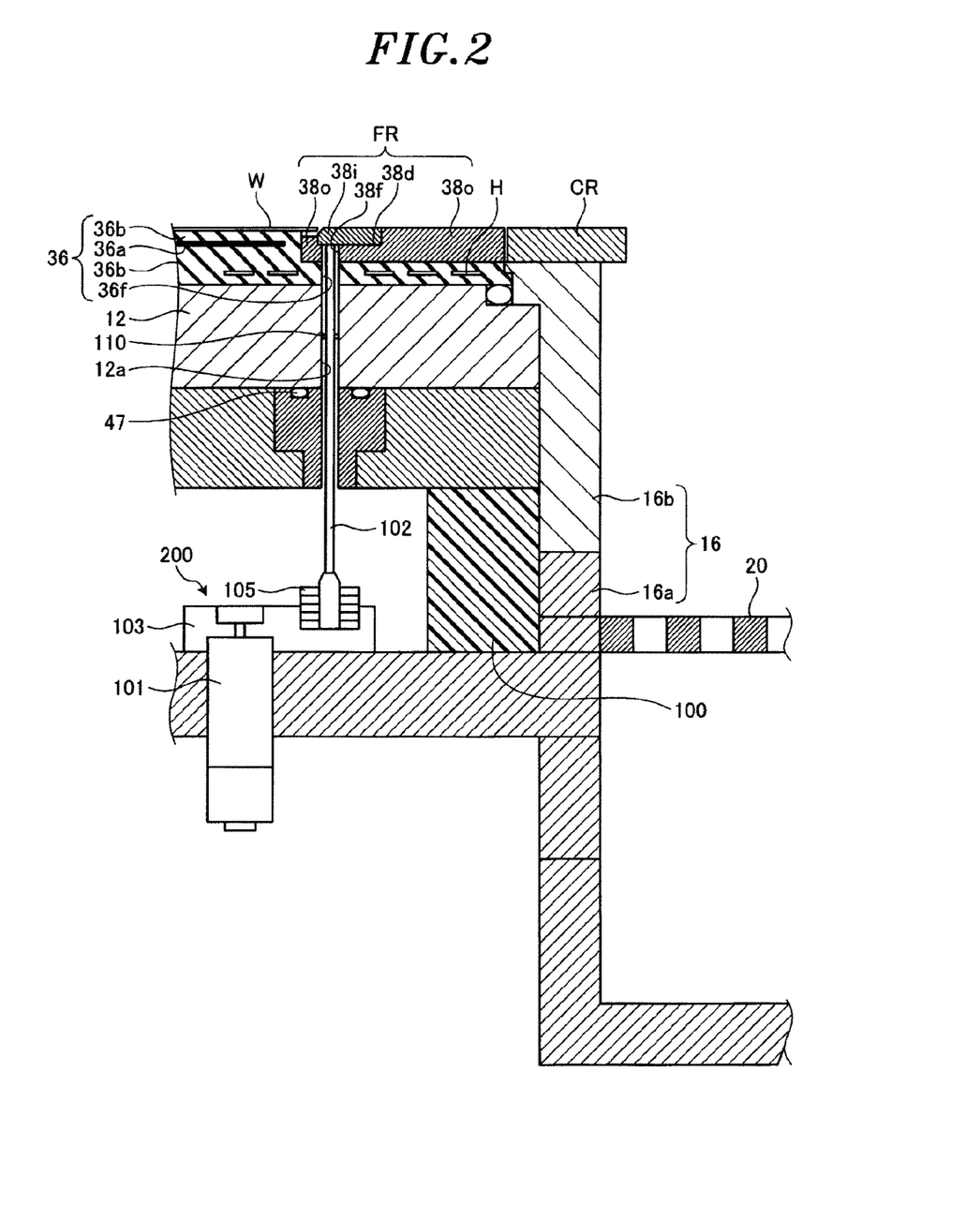
FIG. 2 shows an example of configurations of a focus ring, a lift pin, and a shift mechanism according to the embodiment.

FIG. 2 shows an example of the configurations of the focus ring FR, the lift pins 102, and the shift mechanisms 200 according to the embodiment. In FIGS. 2 to 6B, only one lift pin 102 and one shift mechanism are illustrated for the sake of convenience. First, the shift mechanism 200 will be described with reference to FIG. 2.

The shift mechanism 200 includes a driver 101, a transmitter 103, and a thruster 105.

The driver 101 is, e.g., a motor such as a stepping motor, or an air driving mechanism. The driver 101 is arranged at a position apart from the axial direction of the lift pin 102 and is connected to the lift pin 102 through the transmitter 103 and the thruster 105. The power generated by the driver 101 is transmitted to the thruster 105 and further the lift pin 102 through the transmitter 103. As for a micron level driver, a piezo actuator may be appropriately employed. However, in the present embodiment, a motor such as the stepping motor, the air driver, or the like is employed to perform the first shift control and the second shift control by one shift mechanism 200.

The transmitter 103 is disposed between the driver 101 and the thruster 105 that are disposed on two different axes, and connects the driver 101 and the thruster 105. The transmitter 103 transmits the power of the driver 101 to the thruster 105 and the lift pin 102. The transmitter 103 is configured to connect an end portion of the driver 101 and the thruster 105.

The thruster 105 is provided to absorb the deviation caused by disposing the driver 101 and the lift pin 102 at different axes. The driver 101 and the lift pin 102 are connected by the transmitter 103. Since, however, the driver 101 and the lift pin 102 are disposed at the end portions of the transmitter 103, a direction of the load applied to the lift pin 102 may be deviated from the vertical direction due to the inclination of the transmitter 103 or the like. When the direction of the load applied to the lift pin 102 is deviated from the vertical direction, the lift pin 102 may be damaged. Therefore, the thruster 105 is provided to absorb the deviation in a shift direction of the lift pin 102.

By providing the shift mechanism 200, the power generated by the driver 101 is transmitted to the lift pin 102, and the lift pin 102 is moved vertically.

Meanwhile, depending on the configuration of the plasma processing apparatus 5, the driver 101 and the lift pin 102 may be arranged coaxially. In this case, the transmitter 103 and the thruster 105 may be omitted.

<Configuration Example of Lift Pin 102>

The lift pin 102 is connected to the thruster 105 of the shift mechanism 200 and extends upward from the thruster 105. The lift pin 102 extends thorough through-holes 12a, 36f, and 38f (see FIG. 3A, which will be described later) extending through the stage 12, the electrostatic chuck 36, and the outer focus ring 38O. The upper end of the lift pin 102 is brought into contact with a bottom surface of the inner focus ring 38i to support the inner focus ring 38i. Further, an O-ring 110 is disposed in the through-hole 12a of the stage 12 to partition a vacuum space and an atmosphere space. In the present embodiment, the upper end of the lift pin 102 is in contact with the bottom surface of the inner focus ring 38i even when the first shift control and the second shift control are not performed.

The material of the lift pin 102 is not particularly limited, but the lift pin 102 is preferably made of a material that is less likely to generate particles when exposed to plasma, a material that is less likely to be consumed when exposed to plasma, or a material having a high stiffness. Therefore, the lift pin 102 is preferably made of sapphire or quartz.

<Two Steps of Position Control Using Shift Mechanism 200>

The shift mechanism 200 of the present embodiment is capable of vertically shifting the lift pin 102 during the first shift control and the second shift control. The driver 101 of the shift mechanism 200 is configured to realize a precise vertical shift (first shift control) with a driving precision of 0.02 mm at a pitch of, e.g., 1.0 to 2.0 mm as well as a vertical shift having a larger pitch (second shift control) with a driving precision of about 0.1 mm at a pitch of about 20.0 mm, e.g., 18 mm.

When the first shift control is performed, the driver 101 of the shift mechanism 200 raises the lift pin 102 in response to the consumption of the inner focus ring 38i due to the plasma processing. Accordingly, the positional relationship between the position of the upper surface of the inner focus ring 38i and the position of an upper surface of the wafer W on a wafer support 36c is adjusted to a predetermined level. In one example, the position of the upper surface of the inner focus ring 38i can be aligned with the position of the upper surface position of the wafer W on the wafer support 36c.

When the second shift control is performed, the driver 101 of the shift mechanism 200 raises the lift pin 102 to a position where the inner focus ring 38i is separated from the outer focus ring 38o. The first shift control requires a small pitch and a high driving precision. On the other hand, the second shift control requires a large pitch and does not require the precision as high as that for the first shift control. Therefore, the driver 101 of the shift mechanism 200 can adjust the moving speed of the lift pin 102 during the second shift control to be higher than that during the first shift control.

<Configuration Examples of Inner Focus Ring 38i and Outer Focus Ring 38o>

Next, a configuration example of the focus ring FR according to the embodiment will be described with reference to FIGS. 3A to 3D.

Figure 3A:
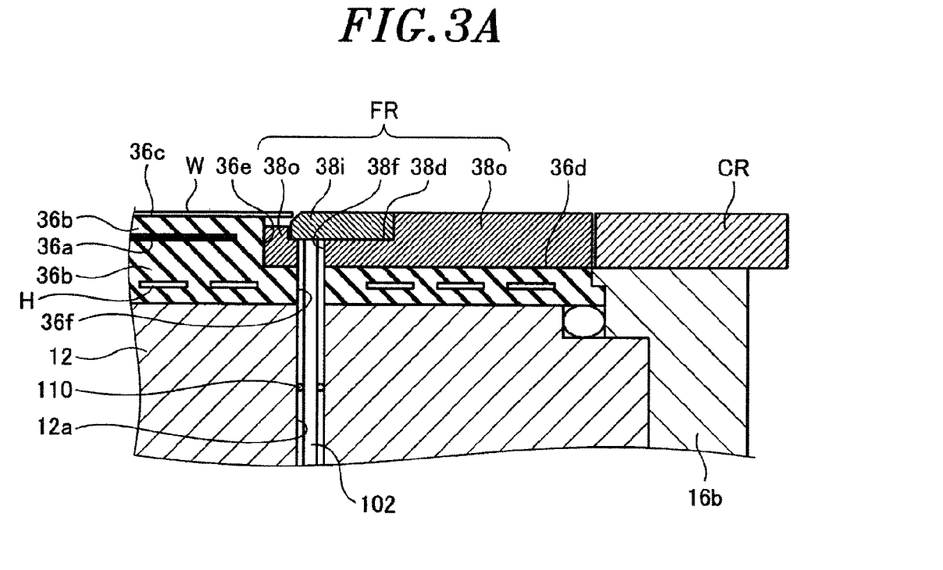
FIG. 3A is a cross-sectional view of the focus ring according to the embodiment.
Figure 3B:
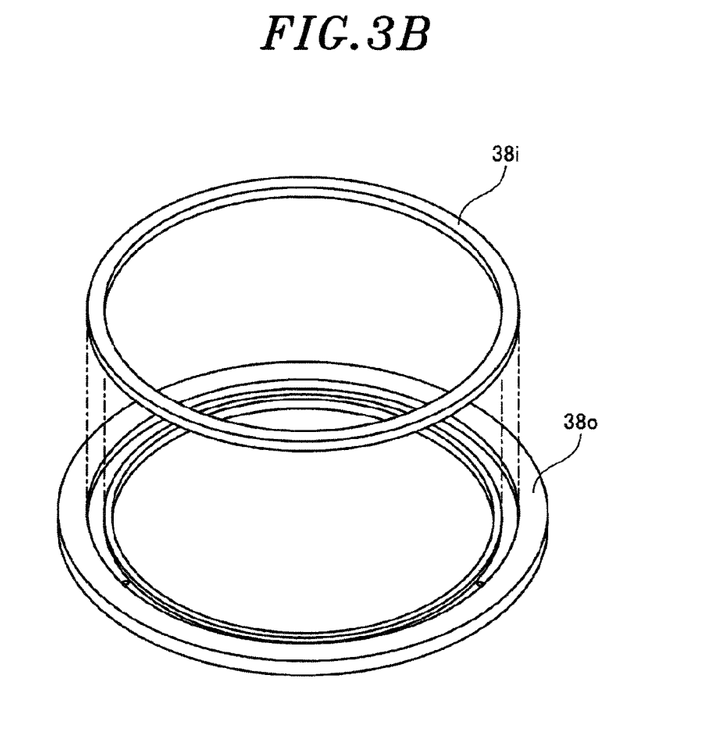
FIG. 3B is a perspective view of the focus ring according to the embodiment.

FIG. 3A is a cross-sectional view of the focus ring FR according to the embodiment. FIG. 3B is a perspective view of the focus ring FR according to the embodiment. In the example shown in FIG. 3A, the electrostatic chuck 36 and the stage 12 constitute a table having an upper surface for mounting thereon the wafer W. The electrostatic chuck 36 has the wafer support 36c to hold the wafer W thereon and a peripheral segment 36d surrounding the wafer support 36c and having through-holes 36f. The peripheral segment 36d has an upper surface lower than that of the wafer support 36c. A stepped portion 36e having a predetermined height is formed between the wafer support 36c and the peripheral segment 36d.

The outer focus ring 38o is disposed while having a clearance of about 0.1 mm to 0.5 mm between the outer focus ring 38o and the peripheral segment 36d of the electrostatic chuck 36 and between the outer focus ring 38o and the stepped portion 36e of the electrostatic chuck 36. In a state shown in FIG. 3A, a bottom surface of the outer focus ring 38o is disposed on the peripheral segment 36d of the electrostatic chuck 36. Further, an inner peripheral surface of the outer focus ring 38o faces the stepped portion 36e of the electrostatic chuck 36. Further, it is preferable to promote heat conduction between the outer focus ring 38o and the electrostatic chuck 36. Therefore, although it is not shown, a heat transfer sheet, e.g., a polymer sheet, may be provided between the outer focus ring 38o and the peripheral segment 36d to promote the heat conduction.

The outer focus ring 38o has a recess 38d formed on an inner side thereof. The recess 38d is a ring-shaped groove having a width of about 5 mm to 10 mm. The recess 38d is formed near the inner peripheral surface of the outer focus ring 38o, e.g., at a position distant from the inner peripheral surface by a distance of about 1 to 2 mm. The recess 38d has a size that allows the inner focus ring 38i to be disposed in the recess 38d. A height of an upper face of the outer focus ring 38o is lower on the inner side than on the outer side of the recess 38d. Further, the through-holes 38f are formed in a bottom surface of the recess 38d to penetrate through the outer focus ring 38o in the vertical direction.

The inner focus ring 38i is a ring-shaped member having a width that allows the inner focus ring 38i to be accommodated in the recess 38d of the outer focus ring 38o, e.g., a width slightly smaller than about 5 mm to 10 mm. In one example, a thicknesses of the inner focus ring 38i and a thicknesses of the outer focus ring 38o may be set such that the height of the upper surface of the inner focus ring 38i becomes substantially the same as that of the upper surface of the outer focus ring 38o when the inner focus ring 38i is disposed in the recess 38d. In the state shown in FIG. 3A, the inner focus ring 38i may be disposed in the recess 38d, and the bottom surface of the inner focus ring 38i may be in contact with the upper end(s) of the lift pin(s) 102 extending through the through-hole(s) 38f.

As shown in FIG. 3B, both of the inner focus ring 38i and the outer focus ring 38o are substantially ring-shaped members. The substantially ring-shaped recess 38d formed on the upper surface of the outer focus ring 38o also serves as a positioning part for the inner focus ring 38i. Therefore, the inner focus ring 38i is not provided with a mark or a structure for positioning, such as a notch, an orientation flat, or the like.

Figure 3C:
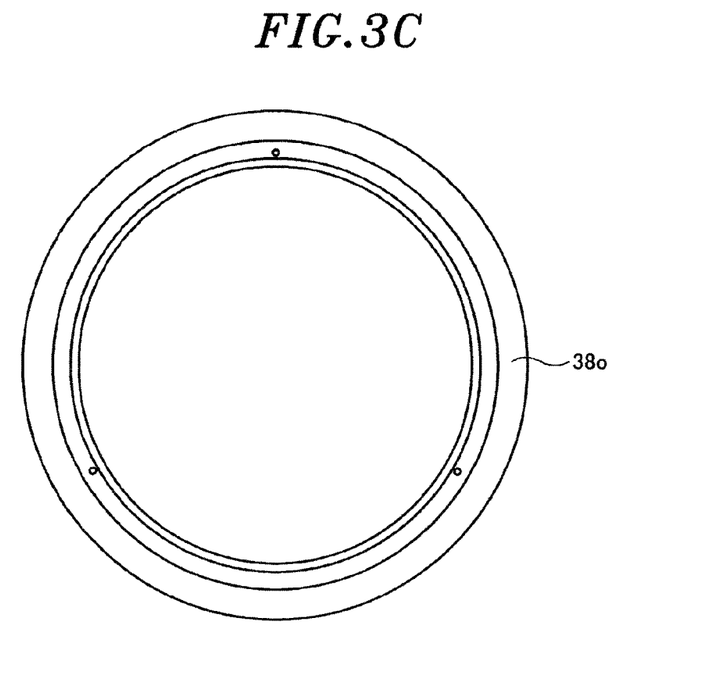
FIG. 3C is a top view of an outer focus ring according to the embodiment.
Figure 3D:
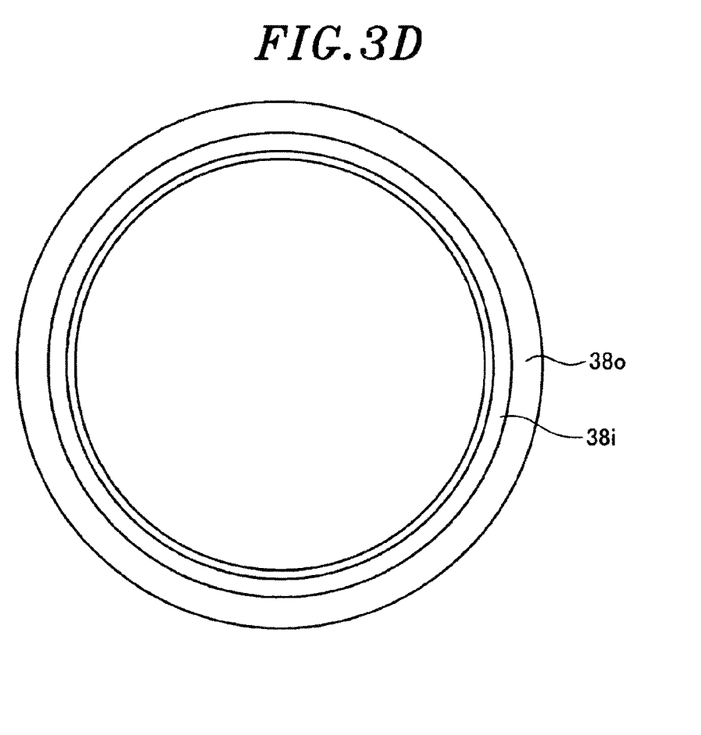
FIG. 3D is a top view showing a state in which an inner focus ring is disposed at the outer focus ring according to the embodiment.

FIG. 3C is a top view of the outer focus ring 38o according to the embodiment. FIG. 3D is a top view showing a state in which the inner focus ring 38i is disposed at the outer focus ring 38o according to the embodiment. As shown in FIG. 3C, a plurality of through-holes 38f (three in the example shown in FIG. 3C) are disposed in the recess 38d of the outer focus ring 38o at the substantially equal intervals in the circumferential direction. When the inner focus ring 38i is disposed in the recess 38d of the outer focus ring 38o, the through-holes 38f are not seen from above.

Referring back to FIG. 3A, the upper face of the outer focus ring 38o is lower on the radially inner side of the recess 38d than on the radially outer side of the recess 38d. This is because, in the configuration shown in FIG. 3A, when the wafer W is held on the wafer support 36c, the outer periphery of the wafer W overhangs above the outer focus ring 38o on the inner peripheral side of the outer focus ring 38o. Further, the inner focus ring 38i has an inner diameter greater than an outer diameter of the wafer W to avoid the interference between the inner focus ring 38i and the wafer W. Further, the upper end of the inner peripheral surface of the inner focus ring 38i has a chamfered upper inner corner.

<Vertical Shift of Focus Ring>

Figure 4A:
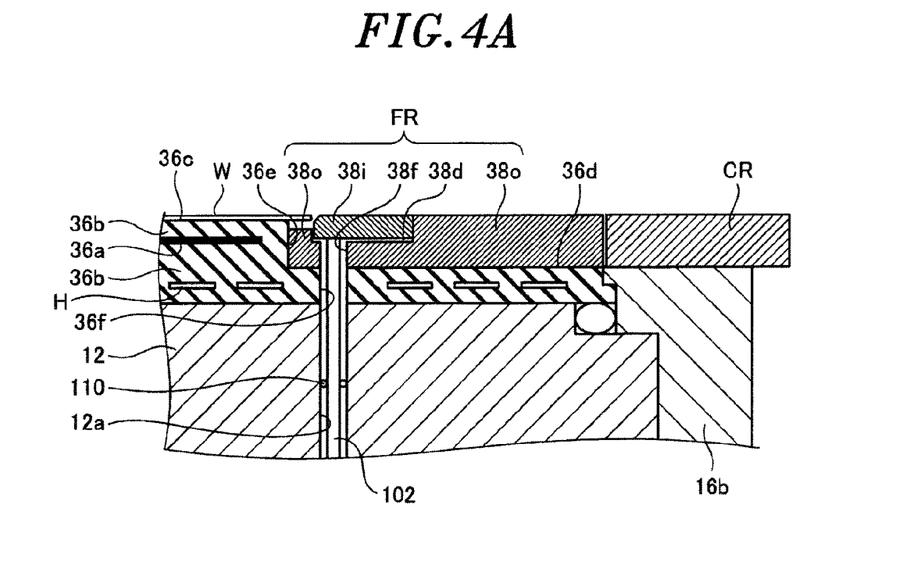
FIG. 4A explains a first shift control of the inner focus ring according to the embodiment.
Figure 4B:
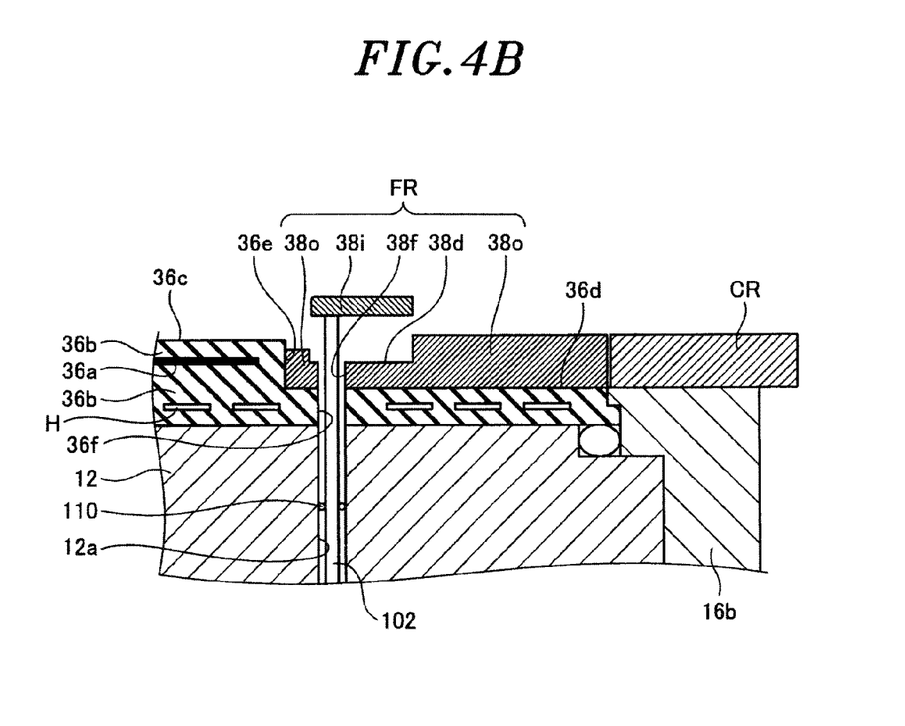
FIG. 4B explains a second shift control of the inner focus ring according to the embodiment.

Next, the shift control of the focus ring FR will be described. FIGS. 4A and 4B explain the first shift control and the second shift control of the inner focus ring according to the embodiment, respectively.

When a new focus ring FR is disposed in the chamber 10, neither the inner focus ring 38i nor the outer focus ring 38o have yet to be consumed by the plasma processing. Therefore, as shown in FIG. 3A, the upper surface of the wafer W held on the wafer support 36c, the upper surface of the inner focus ring 38i, and the upper surface of the outer focus ring 38o on the radially outer side of the recess 38d have a predetermined height relationship. In one example, they have substantially the same height.

When the plasma processing is performed in the chamber 10, the focus ring FR is gradually consumed, and the etching uniformity or the like deteriorates. Therefore, as shown in FIG. 4A, the lift pin 102 is raised by the first shift control of the shift mechanism 200.

Then, the inner focus ring 38i is lifted by the lift pin 102, and the upper surface of the wafer W and the upper surface of the inner focus ring 38i have a predetermined height relationship. In one example, they have substantially the same height. Here, the upper surface of the outer focus ring 38o may not have the predetermined height relationship with the upper surface of the inner focus ring 38i and the upper surface of the wafer W. However, the outer focus ring 38o is far from the wafer W compared to the inner focus ring 38i, and thus is less likely to affect the etching uniformity.

Further, the cleaning using plasma may be performed to remove particles generated in the chamber 10 during the plasma processing. In the case of removing the foreign substances deposited between the inner focus ring 38i and the outer focus ring 38o by the plasma, the lift pin 102 can be raised by the first or the second shift control. This is also applied to modifications to be described later.

As the inner focus ring 38i is repeatedly used and consumed, it is difficult to maintain the etching uniformity. Therefore, the inner focus ring 38i is disassembled and replaced after the plasma processing is performed a predetermined number of times. The number of executions of the plasma processing without replacing the inner focus ring 38i may be determined depending on the type of plasma processing, the thickness of the focus ring FR, or the like. Since the outer focus ring 38o is less likely to affect the etching uniformity compared to the inner focus ring 38i, the frequency of the replacement of the outer focus ring 38o is set to be less than that of the inner focus ring 38i. For example, the outer focus ring 38o may be replaced about once while the inner focus ring 38i is replaced about three to four times. When the inner focus ring 38i is replaced, the outer focus ring 38o remains to cover the peripheral segment 36d of the electrostatic chuck 36. Therefore, even when the inner focus ring 38i is lifted to perform the cleaning using the plasma, the electrostatic chuck 36 is covered by the outer focus ring 38O. Accordingly, the exposure of the electrostatic chuck 36 to the plasma can be suppressed.

When the inner focus ring 38i is replaced, the lift pin 102 is raised by the second shift control of the shift mechanism 200 as shown in FIG. 4B. Then, the inner focus ring 38i is lifted by the lift pin(s) 102 and separated from the outer focus ring 38O. The inner focus ring 38i separated from the outer focus ring 38o is transferred to the outside of the chamber 10 by a robot arm or the like.

In accordance with the plasma processing apparatus according to the embodiment, one shift mechanism 200 can realize both the position control in raising the focus ring FR during the plasma processing and the position control in transferring and replacing the focus ring FR.

<First Modification>

The plasma processing apparatus according to the embodiment can be used to realize a similar position control even in the case of using a focus ring having another shape. Hereinafter, a focus ring according to a first modification will be described.

Figure 5:
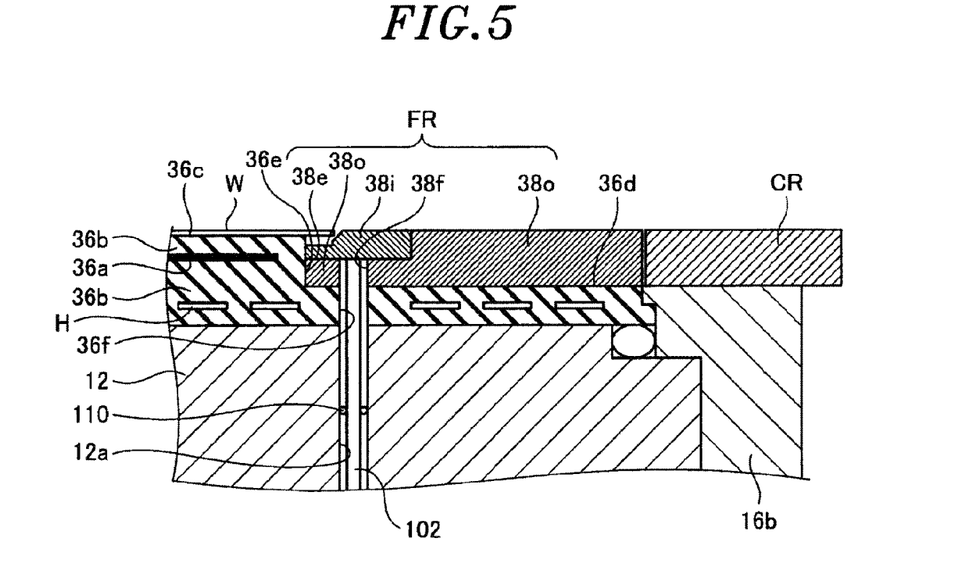
FIG. 5 is a cross-sectional view of a focus ring according to a first modification.

FIG. 5 is a cross-sectional view of a focus ring FR according to a first modification. The focus ring FR according to the first modification has an inner focus ring 38i and an outer focus ring 38o, as in the case of the focus ring FR according to the above-described embodiment. However, in the focus ring FR according to the first modification, the shapes of the inner focus ring 38i and the outer focus ring 38o are different from those in the above-described embodiment.

As shown in FIG. 5, in the focus ring FR according to the first modification, the outer focus ring 38o has a cutout 38e instead of the recess 38d. The cutout 38e is formed at the inner portion of the outer focus ring 38o and has an L-shaped cross section. The inner focus ring 38i is formed to have a size to be fittable in the cutout 38e. Unlike the above-described embodiment, in an initial state, the inner focus ring 38i has an outer portion having the same height level as that of the upper surface of the wafer W and an inner portion having an upper surface lower than that of the outer portion. When the wafer W is held on the wafer support 36c, the outer periphery of the wafer W overhangs above the inner portion of the inner focus ring 38i and the outer periphery of the wafer W faces an inner peripheral surface of the outer portion of the inner focus ring 38i. A thickness of the inner portion of the inner focus ring 38i is set such that a predetermined gap is ensured between the inner portion of the inner focus ring 38i and the wafer W to prevent the wafer W from being displaced by the inner portion of the inner focus ring 38i when the inner focus ring 38i is moved upward by the first shift control.

Figure 6A:
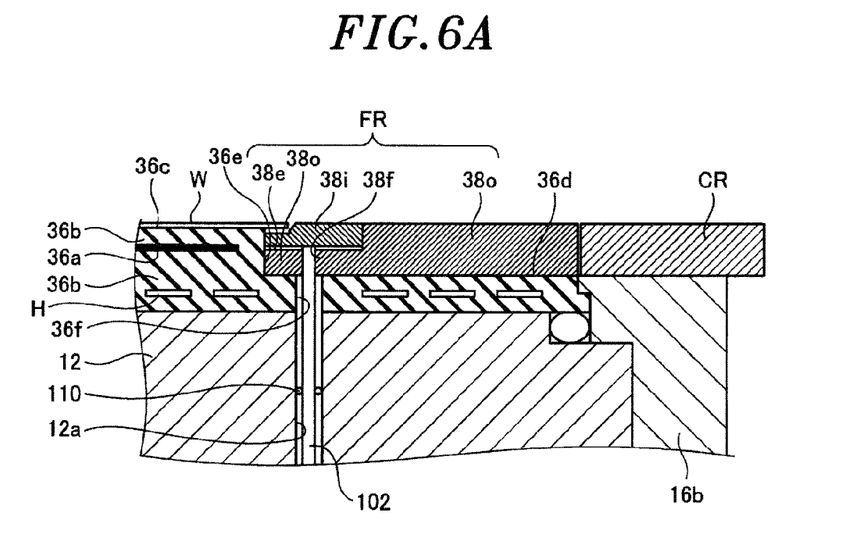
FIG. 6A explains a first shift control of an inner focus ring according to the first modification.
Figure 6B:
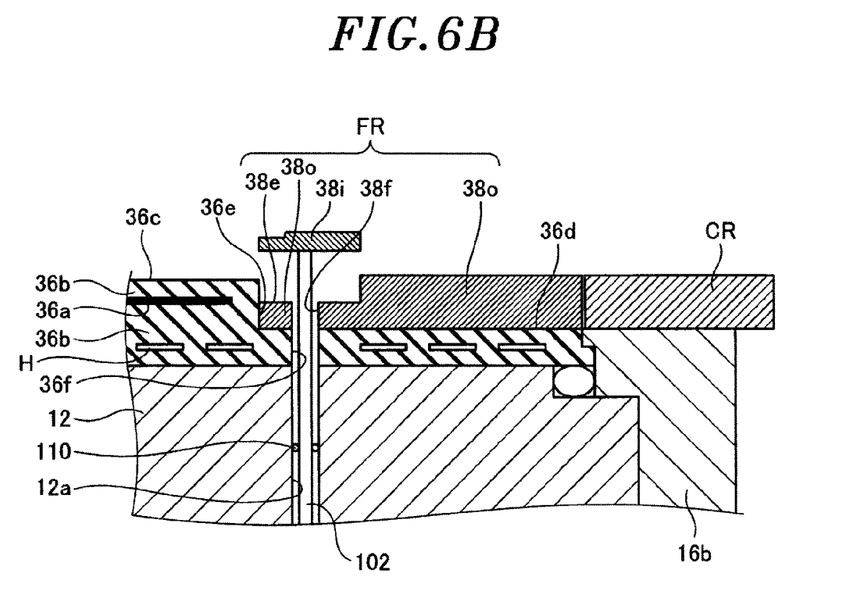
FIG. 6B explains a second shift control of the inner focus ring according to the first modification.

FIGS. 6A and 6B explain the first shift control and the second shift control of the inner focus ring according to the first modification, respectively. As shown in FIGS. 6A and 6B, even in the case of using the focus ring FR according to the first modification, the first shift control and the second shift control of the inner focus ring 38i can be realized by using the shift mechanism 200.

<Second Modification>

In the above-described embodiment and the first modification, the focus ring FR is divided into two parts, i.e., the inner focus ring 38i and the outer focus ring 38O. Further, the plasma processing apparatus performs the first shift control and the second shift control of the inner focus ring 38i. However, the present disclosure is not limited thereto, and the focus ring FR may be formed as one member without being divided into two parts. For example, the inner focus ring 38i and the outer focus ring 38o shown in FIG. 3A or FIG. 5 are formed as one member FR. Then, the shift mechanism 200 controls the position of the upper surface of the focus ring FR as one member and the transfer of the focus ring FR.

In the plasma processing apparatus according to the second modification, the configurations of the lift pin(s) and the shift mechanism(s) are the same as those of the above-described embodiment and the first modification. However, the performance of the driver (motor or the like) included in the shift mechanism or the stiffness of the lift pin can be appropriately changed depending on the size of the focus ring. In the case of transferring the focus ring through the loading/unloading port 27, the size of the loading/unloading port 27 is changed in response to the size of the focus ring.

In the plasma processing apparatus including the focus ring according to the second modification, the positional accuracy of the focus ring can also be improved by using the same shift mechanism as that of the above-described embodiment.

In the above-described embodiment and the first and second modifications, the shift mechanism of the plasma processing apparatus performs both of the driving and the transfer of the focus ring. However, the present disclosure is not limited thereto, and the shift mechanism of the plasma processing apparatus may perform only the second shift control without performing the first shift control. On the contrary, the shift mechanism of the plasma processing apparatus may perform only the first shift control without performing the second shift control. For example, when the focus ring is consumed, only the transfer and the replacement of the focus ring may be performed without adjusting the position of the upper surface of the focus ring. Alternatively, when the focus ring is consumed, the position of the upper surface of the focus ring may be adjusted but the transfer of the focus ring may be performed by opening the chamber.

Further, in the above-described embodiment and the first and second modifications, it is illustrated that the lift pin(s) is constantly in contact with the bottom surface of the inner focus ring. However, the present disclosure is not limited thereto, and the lift pin(s) may not be in constant contact with the focus ring if the shift mechanism(s) is used only for the second shift control (transfer) and not used for the first shift control (driving). For example, the lift pin(s) may be in contact with the inner focus ring only during the second shift control.

When the cleaning for removing particles deposited between the inner focus ring and the outer focus ring is performed, any one of the first shift control and the second shift control may be performed.

<Materials of Parts>

The respective parts of the focus ring FR are made of Si, $SiO_2$, SiC or the like. The outer focus ring 38o and the inner focus ring 38i may be made of the same material or different materials.

<Examples of Dimensions of Components>

It is assumed that the plasma processing apparatus 5 according to the above-described embodiment is configured to process a wafer W having a diameter of 300 mm. Further, for example, a width of the inner focus ring 38i can be adjusted within a range from about 3 mm to 15 mm. For example, the width and the diameter of the inner focus ring 38i may be appropriately set under the condition that an etching rate near the edge portion of the wafer W is changed while the etching rate of the region of the wafer excluding the edge portion of the wafer, which includes the central region of the wafer, is not significantly changed. The outer diameter of the outer focus ring 38o is, e.g., 360 mm.

In the case of processing wafers W having different sizes, the dimensions of the respective components of the plasma processing apparatus 5 including the focus ring FR are adjusted in response to the size of the wafer W.

<Effects of the Embodiment>

The plasma processing apparatus according to the above-described embodiment includes the table, the outer focus ring, the inner focus ring, the lift pins, and the shift mechanisms. The table has the wafer support to hold the wafer thereon and the peripheral segment surrounding the wafer support and having the through-holes, the peripheral segment having an upper surface lower than that of the wafer support. The outer focus ring is disposed over the peripheral segment, and has a recess or a cutout at the inner portion thereof. The recess or cutout has the through-holes. The inner focus ring is disposed in the recess or cutout of the outer focus ring. The lift pins respectively extend through the through-holes of the peripheral segment and the through-holes of the recess or cutout of the outer focus ring. The shift mechanisms control the shift of the respective lift pins. With this configuration, in the plasma processing apparatus of the embodiment, it is possible to prevent the exposure of the table to the plasma by disposing the outer focus ring over the peripheral segment. Further, the plasma processing apparatus of the embodiment further includes the inner focus ring disposed in the recess or cutout of the outer focus ring. Therefore, it is not necessary to form, at the inner focus ring, the notch or the orientation flat for positioning. Accordingly, the marks for positioning and the like are not required, which makes it possible to improve the uniformity of the plasma processing.

Further, in the plasma processing apparatus of the embodiment, the focus ring is divided into two parts. Therefore, the position of the focus ring can be controlled without excessively increasing the number of components. Moreover, in the plasma processing apparatus of the embodiment, the shift, i.e., the elevation, of the inner focus ring is controlled at the position of the recess or the cutout formed at the inner portion of the outer focus ring. Therefore, the position of the inner focus ring can be controlled near the outer periphery of the wafer to be processed, and the positional accuracy of the focus ring can be improved. For example, in accordance with the embodiment, the horizontal position and the height position can be accurately controlled during the first shift control, and the horizontal position can be accurately controlled during the second shift control.

In the plasma processing apparatus, the lift pins may be in contact with the inner focus ring during the plasma processing. For example, in the case that the focus ring is raised and, then, the wafer is processed (the first shift control), the lift pins and the inner focus ring are always in contact with each other during the processing of any wafer. For example, a first wafer is subjected to the plasma processing without raising the focus ring, and a third wafer is subjected to the plasma processing in a state where the focus ring is raised. In that case, in the plasma processing apparatus, the contact state between the lift pins and the inner focus ring is maintained during the processing of the first wafer as well as the processing of the third wafer. Therefore, the plasma processing apparatus according to the embodiment can suppress the variation between the plasma processings in the amount of heat conducted through the lift pins during the plasma processing. Accordingly, in accordance with the embodiment, it is possible to suppress the variation in the processing uniformity between the wafers.

In the plasma processing apparatus, each of the shift mechanisms may vertically shift the corresponding lift pin with at least two levels of precision. Alternatively, the precision used for the first shift control may be applied to that for the second shift control. In accordance with the embodiment, one shift mechanism can be used to realize the first shift control for a precise position control and the second shift control for a position control at a pitch larger than that for the first shift control.

In the plasma processing apparatus, each of the shift mechanisms may vertically shift the corresponding lift pin with a first shift precision of about 0.02 mm and with a second shift precision of about 0.1 mm. The first precision of about 0.02 mm may be used as the second precision. In accordance with the embodiment, one shift mechanism can be used to realize the position control of the inner focus ring and the transfer control of the inner focus ring.

Further, in the plasma processing apparatus, each of the shift mechanisms includes the thruster and the transmitter. The thruster coaxially connected to the corresponding lift pin. The transmitter transmits the power of the driver disposed on an axis different from an axis of the corresponding lift pin to the thruster. Therefore, even if it is difficult to coaxially arrange the shift mechanisms with the lift pins, respectively, due to the restriction in the internal configuration of the plasma processing apparatus, it is possible to suppress the positional displacements of the lift pins and improve the positional accuracy of the focus ring.

Further, in the plasma processing apparatus, the outer focus ring is disposed such that the inner peripheral surface and the bottom surface of the outer focus ring are insulated from the table. Therefore, in accordance with the embodiment, it is possible to suppress the exposure of the insulating film of the table to the plasma through the gaps between the components near the focus ring during the plasma processing.

Further, in the plasma processing apparatus, a plurality of through-holes are disposed at substantially equal intervals in the circumferential direction of the outer focus ring. Therefore, in accordance with the embodiment, the positional displacement caused by the shift of the inner focus ring can be suppressed, and the positional accuracy of the focus ring can be improved.

In the plasma processing apparatus, the inner focus ring has the radial width in a range from 3 mm to 15 mm. Therefore, in accordance with the embodiment, it is possible to improve the uniformity of the plasma processing while appropriately adjusting the radial width of the inner focus ring.

Further, in the plasma processing apparatus, the upper end of the inner peripheral surface of the inner focus ring has a chamfered upper inner corner. Therefore, in accordance with the embodiment, it is possible to suppress the formation of the gap between the focus ring and the wafer.

Further, in the plasma processing apparatus, the height of the upper face of the inner focus ring is lower at the inner side of the inner focus ring than that at the outer side of the inner focus ring. Therefore, in accordance with the embodiment, the uniformity of the plasma processing can be improved by providing the focus near the wafer.

The plasma processing apparatus further includes the table, the focus ring, the lift pins, and the shift mechanisms. The table has the wafer support to hold thereon the wafer, and the peripheral segment surrounding the wafer support and having the through-holes, the peripheral segment having the upper surface lower than that of the wafer support. The focus ring is disposed over the upper surface of the peripheral segment of the table, and the inner peripheral surface of the focus ring is disposed to face the outer peripheral surface of the wafer support. The lift pins respectively extend through the table to raise the focus ring. The shift mechanisms control the shift of the respective lift pins, with one of the first shift precision and the second shift precision different from the first shift precision. Further, in the plasma processing apparatus, the first shift precision is higher than the second shift precision. Therefore, the positional accuracy of the focus ring can be improved by allowing the shift mechanisms to control the vertical shift of the respective lift pins with two types of shift precision.

In the plasma processing apparatus, the first shift precision is used for raising the focus ring to the plasma processing position, and the second shift precision is used for raising the focus ring to the unloading position. Therefore, it is possible to improve the positional accuracy of the focus ring by controlling the position of the focus ring with the precision suitable for the plasma processing and the precision suitable for the unloading of the focus ring.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A method for processing a substrate with a plasma processing apparatus, the plasma processing apparatus including:
   a plasma processing chamber;
   a substrate support disposed in the plasma processing chamber, the substrate support including an electrostatic chuck, the electrostatic chuck having a central portion and a peripheral portion surrounding the central portion, the peripheral portion of the electrostatic chuck having a plurality of first through-holes;
   a first ring disposed on the peripheral portion of the electrostatic chuck, the first ring having an inner portion, an intermediate portion and an outer portion, the intermediate portion having a plurality of second through-holes;
   a second ring disposed on the intermediate portion of the first ring, a radially outer edge of the second ring being surrounded by the outer portion of the first ring;
   a plurality of lift pins respectively extending through the plurality of first through-holes and the plurality of second through-holes; and
   one or more shift mechanisms including one or more drivers to vertically shift the plurality of lift pins,
   the method comprising:
   vertically shifting the plurality of lift pins with a first vertical shift to adjust an upper surface of the second ring in response to consumption of the second ring; and
   vertically shifting the plurality of lift pins with a second vertical shift longer than the first vertical shift to transfer and replace the second ring, wherein the first vertical shift has a driving precision of 0.02 mm and the second vertical shift has a driving precision of 0.1 mm.

2. The method according to claim 1, wherein the first vertical shift is in a range of 1 mm to 2 mm.

3. The method according to claim 2, wherein the second vertical shift is about 20 mm.

4. The method according to claim 3, wherein the second vertical shift is 18 mm.

5. The method according to claim 1, wherein the plurality of lift pins are vertically shifted with the first vertical shift to adjust the upper surface of the second ring at a same height as an upper surface of the outer portion of the first ring.

6. The method according to claim 1, wherein the first ring has a recess defined by an outer sidewall of the inner portion, an upper surface of the intermediate portion and an inner sidewall of the outer portion, and the second ring is fitted in the recess.

7. The method according to claim 1, wherein an upper surface of the inner portion is higher than an upper surface of the intermediate portion.

8. The method according to claim 1, wherein an upper surface of the inner portion faces a rear surface of a substrate placed on the central portion.

9. The method according to claim 1, wherein the inner portion vertically overlaps with a substrate placed on the central portion.

10. The method according to claim 1, wherein a radially outer edge of the inner portion of the first ring is surrounded by the second ring.

11. The method according to claim 1, wherein the plurality of lift pins are in contact with the second ring during plasma processing.

12. The method according to claim 1, wherein the first ring has a recess defined by an outer sidewall of the inner portion.

* * * * *